United States Patent [19]

Kawashima et al.

[11] 4,264,397
[45] Apr. 28, 1981

[54] APPARATUS FOR STICKING NONCONDUCTIVE TAPE HAVING PLATING PERFORATIONS TO SHEET METAL

[75] Inventors: Shunichi Kawashima, Osaka; Eiichi Miyake, Toyonaka, both of Japan

[73] Assignees: Hakuto Co., Ltd., Tokyo; Sanei Engineering Co., Ltd., Osaka, both of Japan

[21] Appl. No.: 79,941

[22] Filed: Sep. 26, 1979

[30] Foreign Application Priority Data

Sep. 29, 1978 [JP] Japan ................... 53-120234

[51] Int. Cl.³ .............................................. B65H 25/00
[52] U.S. Cl. ...................................... 156/361; 29/829; 156/252; 156/324; 156/513; 156/629
[58] Field of Search ............... 156/629, 630, 250, 252, 156/324, 513, 150, 361; 29/829, 830, 835

[56] References Cited

U.S. PATENT DOCUMENTS

| | | | |
|---|---|---|---|
| 2,526,568 | 9/1970 | Kepple et al. | 156/630 X |
| 2,760,290 | 8/1956 | Miller et al. | 156/361 |
| 3,518,756 | 7/1970 | Bennett | 156/150 X |
| 3,748,205 | 7/1973 | Adams | 156/513 X |
| 3,953,274 | 4/1976 | Winrow et al. | 156/252 |
| 4,067,760 | 1/1978 | Nelson | 156/361 X |

*Primary Examiner*—David A. Simmons
*Attorney, Agent, or Firm*—Wenderoth, Lind & Ponack

[57] ABSTRACT

Apparatus for sticking nonconductive tape including plating perforations to sheet metal comprises supply means for metal tape, feed means for nonconductive tape, punching means for perforating nonconductive tape to make plating perforations therein, a device for heating and pressure-sticking the metal tape and the perforated nonconductive tape together, cooling means for the tapes, and control means for monitoring the position of the plating perforations and controlling the running speed of the nonconductive tape.

2 Claims, 4 Drawing Figures

APPARATUS FOR STICKING NONCONDUCTIVE TAPE HAVING PLATING PERFORATIONS TO SHEET METAL

BACKGROUND OF THE INVENTION

This invention relates to apparatus for manufacturing electronic components, more particularly providing metal sheet on which a tape with thermosetting adhesive is applied so that electronic components e.g., lead wire, connector and flexible board can be plated with metal effectively and successively only to required portions.

Connecting terminals of electronic components such as LSI, IC, transistor and connector are made from metal strip or metal tape through punching process in which they are stamped out successively into a desired shape.

Such stamped components are plated with metal for various purposes while this plating process is, in conventional manner, operated before the aforementioned punching process.

In such prior technique, metal plating treatment on metal tape comprises the steps of sticking nonconductive tapes N on each edge of the metal tape 4 (FIG. 1), and applying metal plating to a center portion M on which nonconductive tape is not bonded. However, according to such procedure, much of the plating material is wasted and product cost increases, because portions other than those being stamped out are also plated with metal.

SUMMARY OF THE INVENTION

It is a principal object of this invention to provide an improved apparatus for sticking nonconductive tape in correct register with to the subject metal sheet exclusive of portions to be plated and then applying metal plating only to said portions, so that plating material is saved and product cost is decreased.

DETAILED DESCRIPTION OF THE PREFERRED EMBODIMENTS

Figure 1:
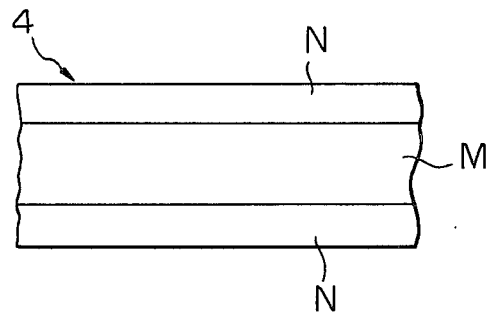
FIG. 1 is a plan view of the metal sheet according to prior art.
Figure 3:
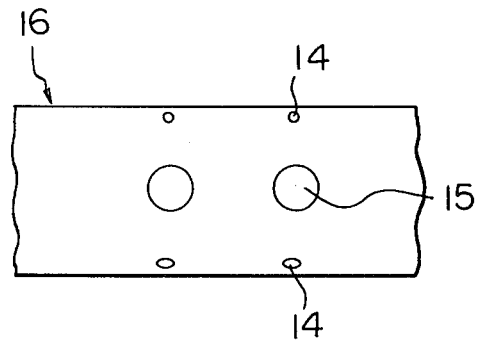
FIG. 3 is a plan view of the metal tape of this invention.
Figure 2:
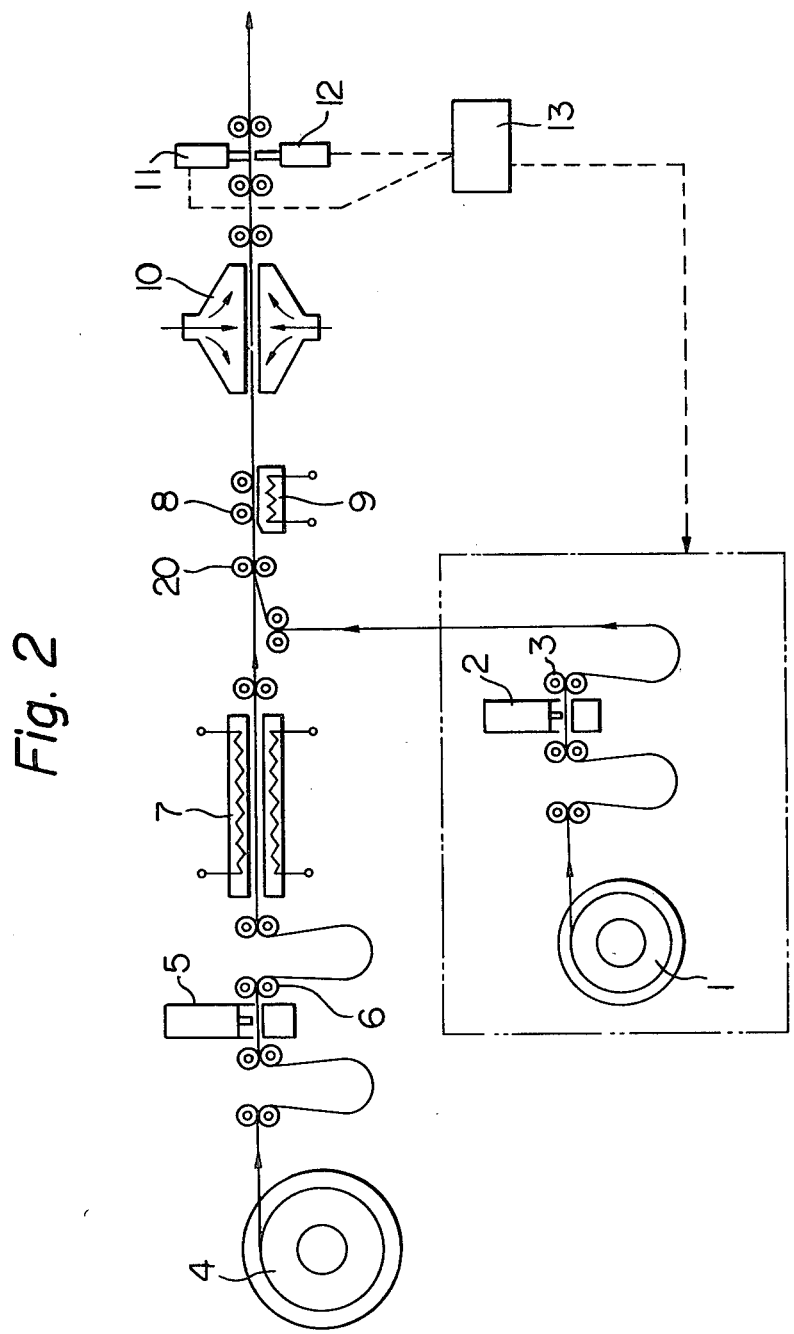
FIG. 2 is a schematic side view of the sticking apparatus embodying the invention.

Referring to FIG. 2, sticking apparatus for applying a nonconductive tape in correct register with to metal sheet material (referred as "metal tape" hereinunder) is schematically illustrated. In FIG. 2, a nonconductive tape 1 is applied with thermosetting adhesives to one side thereof while tape 1 is preferably made from laminated material or the like. The nonconductive tape 1 in the state of a roll is pulled out by feed roller 3, and then the tape 1 is perforated to produce perforations 15 (FIG. 3) through punching press which is located adjacent the roller 3. These perforations 15 are used to define the portions to be plated with metal when the tape 1 is stuck to a metal tape 4. Therefore, the perforations can be made in any desired shape corresponding to the shape of the electronic component.

The metal tape 4 is, after the metal plating treatment, treated by cutting or other working process and transformed into electronic components such as lead wire or connector. In the first place, the metal tape 4 is stored around a reel in the state of a roll in the same way as the nonconductive tape 1. Then the tape 4 is pulled out therefrom by supply roller 6 and pilot holes 14 (FIG. 3) are made therein by punching press 5.

As mentioned above, the nonconductive tape 1 and the metal tape 4 are pulled out and perforated independently of each other. Then, they are combined when passing through fitting roller 20 and further are stuck together when passing through the gap between a pressing roller 8 and a heater 9 which are located at the downstream side of the fitting rollers 20. Alternatively, the metal tape 4 can be heated by preheater device 7 which is located at the upstream side of the fitting rollers 20. This way ensures joining and sticking between the metal tape 4 and the nonconductive tape 1.

The metal tape having a nonconductive tape stuck thereon is then carried to a cooling device 10 where it is colled and cured.

Thus, the resultant assembly 16 comprising a metal tape and a nonconductive tape is provided with pilot holes 14 in the metal tape 4 and plating perforations 15 in the nonconductive tape 1. Since the plating perforations 15 are equally spaced, the plating operation is applied in the correct position to each plating perforation at constant intervals. However, as mentioned above, the nonconductive tape 1 is made from laminated material, so an extension thereof is greater than that of the metal tape 4. Furthermore, the degree of extension of the nonconductive tape can not be kept constant because extension force is applied to the tape by the feed roller 3. Thus in actual process, there is danger that the spacing between the plating perforations 15 of the nonconductive tape 1 will sometimes differ.

Even when only an error of 0.01 mm is produced between the adjacent plating holes 15, in case hundreds of perforations should be made on the nonconductive tape, there will be a cumulative error of several millimeters in all whereby plating operation of the delicate electronic components becomes unsatisfactory.

Figure 4:
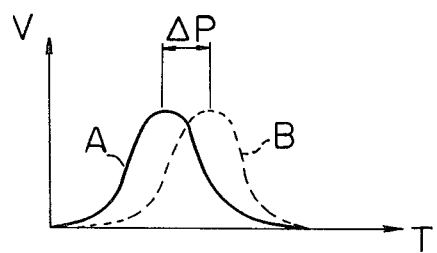
FIG. 4 is a diagrammatic view illustrating signals obtained by perforation monitor included in this invention.

For the purpose of eliminating such disadvantages, in this invention, a perforation monitoring device 11, 12 is provided so as to inspect whether plating perforations 15 in the nonconductive tape 1 are in alignment with pilot holes 14 in the metal tape 4 or not. This perforation monitoring device 11, 12 is, for example, made by optical means such as a pair of photo sensors. One of the photo sensors 11 inspects the position of the pilot holes 14 in the metal tape 1 and the other sensor 12 inspects the position of the plating perforations 15 in the nonconductive tape 1. Each of the photo sensors 11, 12 feeds a detecting signal of the position and transfers the feedback signal to a tape speed controller 13. The detecting signals put into the controller 13 are illustrated as a signal A (from the sensor 11) and a signal B (from the sensor 12) in FIG. 4, in which horizontal axis indicates time T and vertical axis indicates an amplitude such as voltage V.

If a horizontal difference $\Delta P$ between the signal A and the signal B does not appear, it is found that the plating perforations 15 are in alignment with the pilot holes 14. In proportion to the difference $\Delta P$, a degree of an error of the alignment can be found. If the difference ΔP exceeds a predetermined value, the controller 13 feeds such signal to the feed rollers 3 and controls running speed of the nonconductive tape 1 by regulating the speed of the rotation of the feed rollers 3.

Thus, according to the apparatus of this invention, on the surface of the metal tape 4 uniformly spaced portions to be plated are produced and those portions which are not to be plated are fully covered with a nonconductive tape.

As a result, plating of the required portions of the metal tape can be done in proportion to the intervals corresponding to the distances between the plating perforations 15, so that the plating will operate efficiently and at lower cost.

After this plating operation, the metal tape 4 is carried to the punching station and punching of a predetermined pattern is performed so as to shape the electronic components required.

In the above embodiment, position control of the plating perforations is carried out by detecting an error of the alignment between the plating perforations 15 and the pilot holes 14. However, such control is not restricted to the aforementioned method. Alternatively, perforating process of the pilot holes 14 can be omitted so that running speed of the nonconductive tape 1 is controlled by detecting directly the distances between the plating perforations 15 in the nonconductive tape 1.

According to the recent technique, a flexible board is used for portable electronic calculators, wherein points of contact between terminals of the base plate and a key board are applied with metal plating. In such cases, according to this invention, application of plating to the flexible board can be efficiently performed by substituting the roller for the metal tape 4 of the invention for a roller for flexible board.

While a particular embodiment of the apparatus according to the invention has been shown and described, it should be understood that the invention is not limited thereto since many modifications may be made.

What is claimed is:

1. Apparatus for sticking nonconductive tape having plating perforations to sheet metal comprising;
   supplying rollers (6) for supply metal tape (4), feed rollers (3) for feeding nonconductive tape (1) in parallel relation to said metal tape, a punching press (2) for successively perforating said nonconductive tape to make plating perforations (5) therein, a device for heating and pressure-sticking (8, 9) said metal tape and perforated nonconductive tape together, cooling means (10) located at the downstream side of said sticking device for cooling the tapes stuck together, monitoring means (12) located at the downstream side of said cooling means for detecting the positions of said plating perforations in the tape, and control means (13) for receiving a signal from said monitoring means so as to keep the distance between said plating perforations at a predetermined value by regulating the speed of rotation of said feed rollers (3).

2. The apparatus claimed in claim 1 which further comprises a punching press (5) for successively perforating said metal tape (4) to make pilot holes (14) therein, and second monitoring means (11) adjacent said first monitoring means (12) for detecting the positions of said pilot holes, whereby said control means (13) is effective to detect any error in alignment between said plating perforations and said pilot holes.

* * * * *